United States Patent [19]

Sasai et al.

[11] Patent Number: 5,034,919
[45] Date of Patent: Jul. 23, 1991

[54] CONTENT ADDRESSABLE MEMORY

[75] Inventors: Kiyotaka Sasai, Tokyo; Tohru Sasai, Kawasaki, both of Japan

[73] Assignee: Kabushiki Kaisha Toshiba, Kawasaki, Japan

[21] Appl. No.: 526,937

[22] Filed: May 22, 1990

[30] Foreign Application Priority Data

May 23, 1989 [JP] Japan ................................. 1-127770

[51] Int. Cl.⁵ .............................................. G11C 15/00
[52] U.S. Cl. ...................................... 365/49; 365/203
[58] Field of Search ................................ 365/49, 203

[56] References Cited

U.S. PATENT DOCUMENTS 4,975,872 12/1990 Zaiki ..................................... 365/49

Primary Examiner—Terrell W. Fears
Attorney, Agent, or Firm—Foley & Lardner

[57] ABSTRACT

A content addressable memory (CAM) comprises a plurality of CAM cells, a CAM cell block comprising the CAM cells, a CAM array arranging a plurality of the CAM cell blocks to the row direction, a work line arranging a predetermined direction in each of the CAM cell blocks, a block matching line for outputting a result of a retrieval operation in the CAM cells connected to the same word line in the same CAM block and installed corresponding to the same word line, an array matching line for outputting the result of the retrieval operation output to the block matching line, and transfer circuits for transferring the result of the retrieval operation to the array matching line. Another CAM further comprises masking circuits for masking retrieval data at a predetermined CAM block.

10 Claims, 7 Drawing Sheets

CONTENT ADDRESSABLE MEMORY

BACKGROUND OF THE INVENTION

1. Field of the Invention

The present invention relates to a content addressable memory for operating at a high speed even though the number of data of retrieval is increased.

2. Description of the Prior Art

There are memory cells of Content Adressable Memory (referred to as CAM hereinafter) having an associative function, such as TLB (Translation Lookaside Buffer), BTB (Banch Target Buffer), and the like, as shown in FIGS. 1 and 2.

In the same diagrams, a CAM cell 5 is composed of a cell portion 1 selected by a word line 4 for storeing an information given from a data line 6, and an Exclusive OR (XOR) portion 3 for comparing the information in the cell 1 and a retrieval data given from a retrieval line 8.

In such the composition of the conventional CAM cell 5, it compares the retrieval data with a content of the information in the cell portion 1 at the XOR portion 3 for detecting whether they agree or not. The result of the retrieval operation is output through a matching line (a retrieval output line) 2.

The CAM is made up of the CAM cells 5 having the above mentioned composition arranging like a matrix, as shown in FIG. 3. A CAM cell array as shown in the same diagram are arranged the CAM cells 5 in seven lines and eight rows. In this case, a maximum retrieval data is eight bits. Namely, the eight memory cells (per one row) are connected to the same word line 4 and the same matching line 2. Accordingly, a retrieval data of the eight bits connected to the same word line 4 at the CAM cells 5 is output to the common matching line 2. When the CAM is operated dynamically, the matching line 2 is setted in a precharge state by a precharge transistor 7 controlled in synchronization with a clock signal (CLK) $\phi$. On the other hand, when the CAM is operated statically, the matching line 2 is connected to a power source (a symbol "$\nabla$" as shown in FIG. 3) through a load transistor 9 which is always kept in electrical continuity.

In the above mentioned composition, a verification between the retrieval data and the information in the CAM cell 5 output to the word line 4 is performed at the same time on all word lines (see in FIG. 3). When the retrieval data and the information in the memory cells 5 per the row are same, the matching line 2 connected to the CAM cells 5 in the row becomes high-level (referred to as H-level hereinafter) and thereby a retrieval result as a success to retrieve is output to outside of the CAM.

While, the matching line 2 of the CAM cells 5, in which different information from the retrieval data in content is stored, connected to the same word line 4 becomes low-level (referred to as L-level hereinafter) so that a retrieval results as a failure to retrieve is output to outside of the CAM.

The CAM of the composition as shown in the FIG. 3, when the number of bits of the retrieval data is increased, the number of CAM cells connected to the same word line is increased. Similarly, the number of CAM cells connected to the same matching line is also increased. By the way, there is a drain capacity, as a load capacity, of a field effect transistor (FET) in the XOR portion 3 connected to the matching line 2. Accordingly, when the number of the CAM cells connected to the matching line 2 is increased, the number of the FET connected to the matching line 2 is increased and thereby the load capacity of the matching line 2 is increased.

For instance, when the number of the bits of the retrieval data is twice, the load capacity of the matching line becomes about twice. Accordingly, when a failure of a retrieval operation occures, it takes longer for changing from the H-level to the L-level on the matching line 2. Thereby a retrieval speed is decreased and to execute a retrieval operation at a high speed in the CAM therefore becomes more dificult.

SUMMARY OF THE INVENTION

The present invention is invented in the light of the above mentioned problem.

An object of this invention is to provide a CAM by which a retrieval operation is performed at a high speed and a result of the retrieval operation is also output at a high speed even though the number of bits of a retrieval data is increased.

To achieve the above mentioned problem, in accordance with the preferred embodiment of this invention, a content addressable memory (CAM) comprises a plurality of CAM cells, a CAM cell block comprising the CAM cells, a CAM array obtained by arranging a plurality of the CAM cell blocks, a word line for connecting to the CAM cells arranged a predetermined direction in the CAM cell block, a block matching line for outputting a result of a retrieval operation at each of the CAM cell connected to the same word line in the same CAM block and installed corresponding to the same word line, an array matching line for outputting the result of the retrieval operation at each of the block matching lines arranged the predetermined direction, and a transfer means for transferring the result of the retrieval operation on the block matching line to the array matching line.

Accordingly, the load capacity of the matching line for outputting the result of the retrieval operations can be decreased. Moreover, when the number of the bits as the retrieval data is increased, the whole result of the retrieval operations can be output at a high speed.

In the CAM having the abovementioned composition, each of the information of the CAM blocks is retrieved at the same time and the result of the retrieval operation at each of the CAM blocks are output through the transfer means to the array matching lines and thereby a whole result of the retrieval operations at each of the CAM blocks is given.

According to another preferred embodiment of the invention, a content addressable memory comprises a composition given by the installation of additional masking means for masking a retrieval data at each of the CAM cell blocks to the above descrived content addressable memory.

By using the CAM having the masking function, for example, lower-bits of retrieval data are masked so that only upper bits of it can be retrieved with a high speed.

These and other objects, feature and advantages of the present invention will be more apparent from the following description of a preferred embodiment, taken in conjunction with the accompanying drawing.

DETAILED DESCRIPTION OF THE EMBODIMENT

Hereinafter, the preferred embodiments of the present invention are described below with reference to the drawings.

Figure 4:
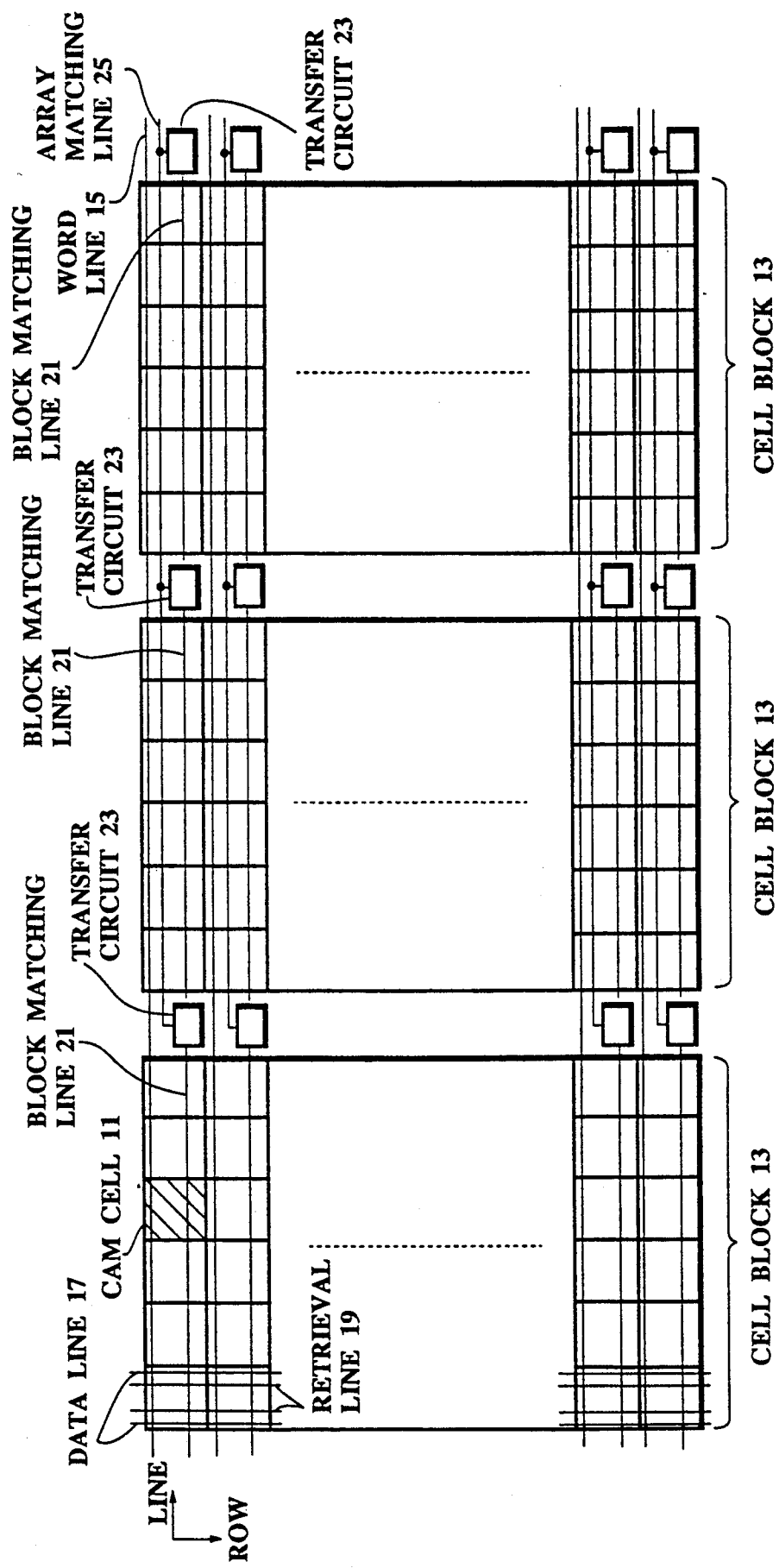
FIG. 4 is a entire composition diagram of a CAM according to an embodiment of this invention.

FIG. 4 is an entire compositional diagram of a CAM according to an embodiment of this invention. In the CAM as shown in the same diagram, a CAM cell array 10 is divided into three CAM memory cell blocks (referred to as cell blocks hereinafter) in a column direction (a line direction). A block matching line 21 is installed in each of the cell blocks. Moreover a result of a retrieval operation of each of the cell blocks is given to an array matching line 25 in the CAM cell array 10. In each of the cell blocks 13, a maximum retrieval bit is six bits. A whole retrieval bit therefore becomes eighteen bits per the CAM cell array 10 in the embodiment.

The CAM cells 11 in the same line in each cell blocks are connected to a same word line 15. The CAM cells in a same row in each of the cell blocks 13 are connected to a same data line 17 and a same retrieval line 19.

In each of the cell blocks 13, each XOR portions (not shown) of the six CAM cells in the same line is connected to a same block matching line 21.

A result of a retrieval operation of a maximum of six bits is output to the block matching line 21. Each block matching lines 21 in the same line is connected to the same array matching line 25 as a whole block matching line through a transfer circuit 23 installed corresponding to them.

The transfer circuit 23 outputs a result of retrieval operation given on the block matching line 21 to the array matching line 25 in each of the lines of each of the cell blocks 13. Namely, the transfer circuit 23 is a circuit for getting a retrieval result as a entire retrieval operation result in the three cell blocks 13 per one line.

Next specific compositions of the transfer circuit 23, the block matching line 21, and the array matching line will be descrived as follows.

Figure 5:
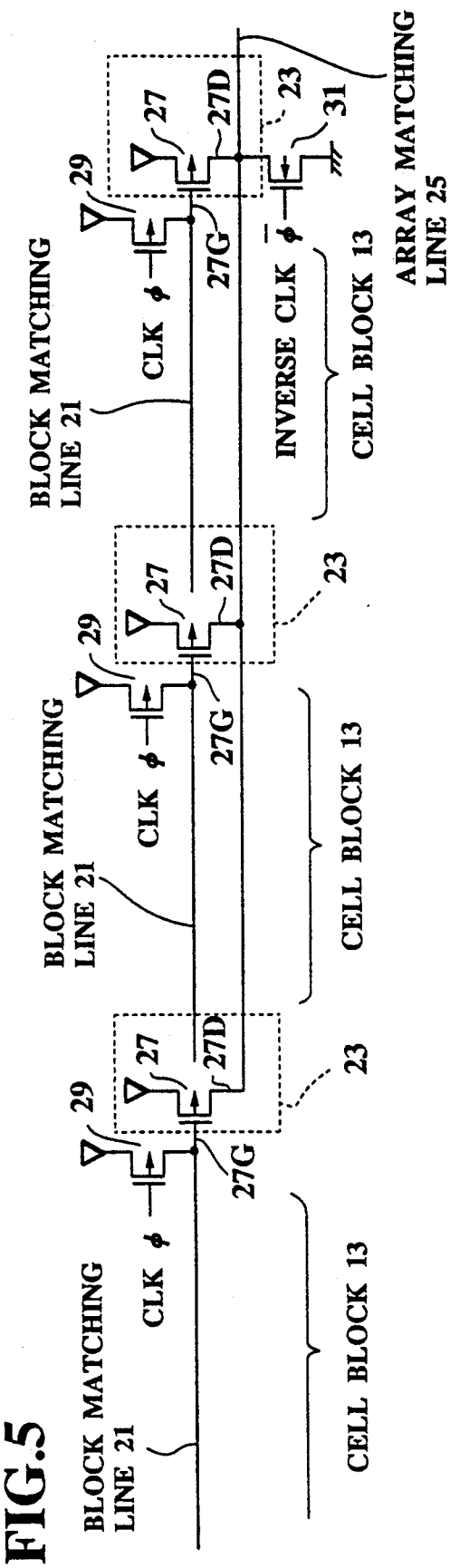
FIGS. 5 to 6 are partial diagrams of the CAM shown in FIG. 4.

FIG. 5 is a compositional diagram for explayning dynamic operation of the CAM according to the embodiment.

Figure 1:
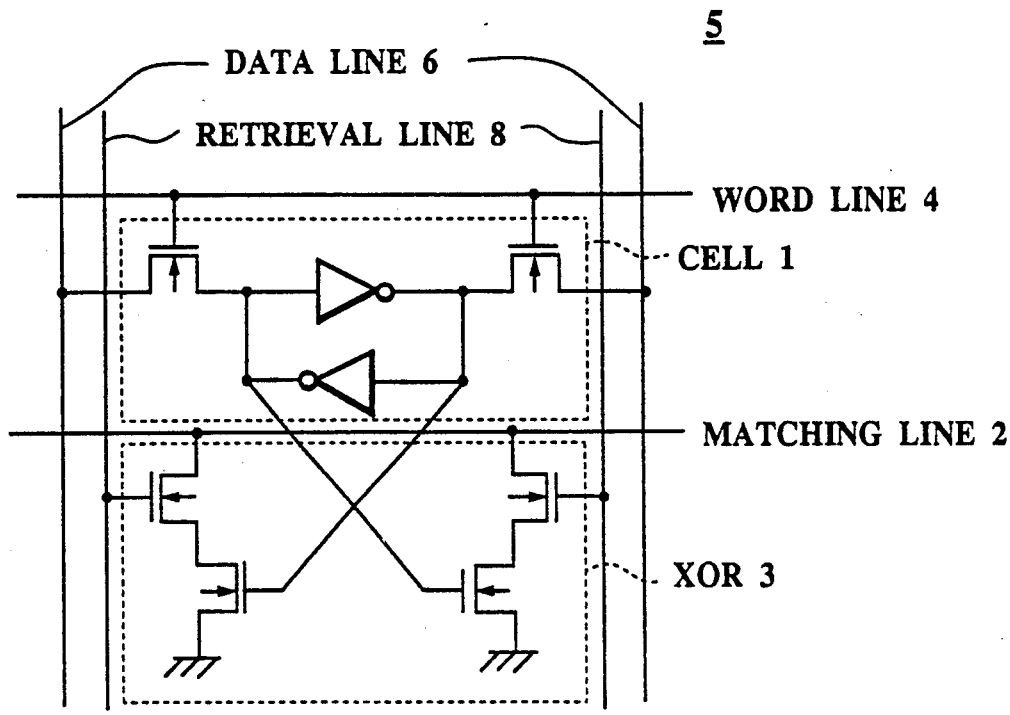
FIGS. 1 and 2 are compositional diagrams of a circuit of a conventional CAM.
Figure 2:
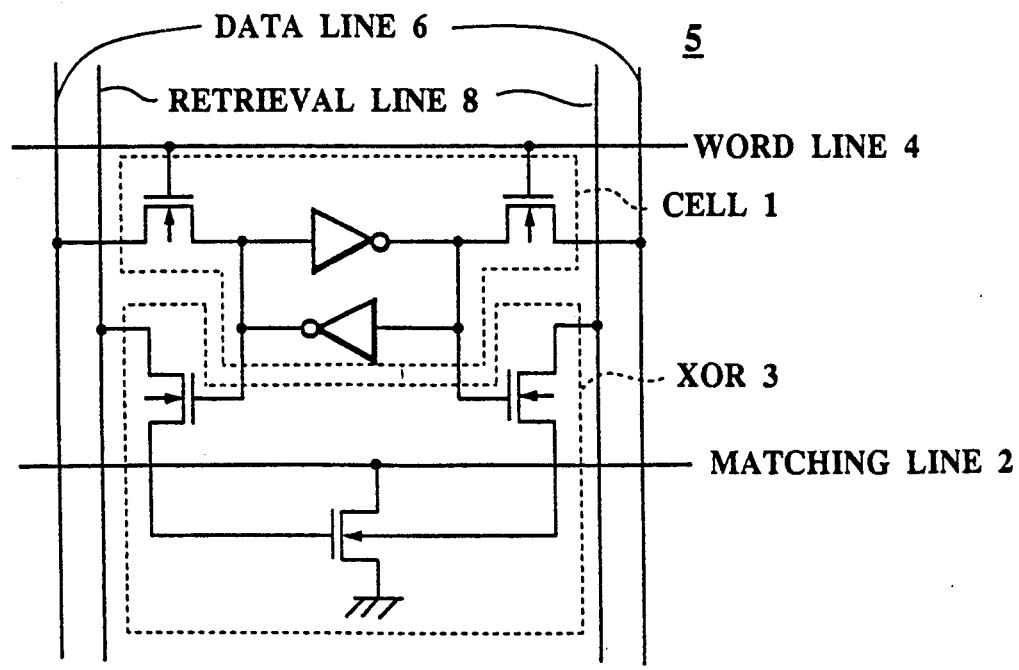

In the composition of the CAM as shown in the same diagram, the XOR portion in the CAM cell 11 is composed of N-channel transistors just as the transistors as shown in FIGS. 1 and 2.

In the same diagram, the transfer circuit 23 is composed of a transfer transistor 27 of P-channel. In the transfer transistor 27 in each of the transfer circuits 23, a gate terminal 27G is connected to the block matching line 21 corresponding to it and a drain terminal 27D is connected to the array matching line 25.

Figure 3:
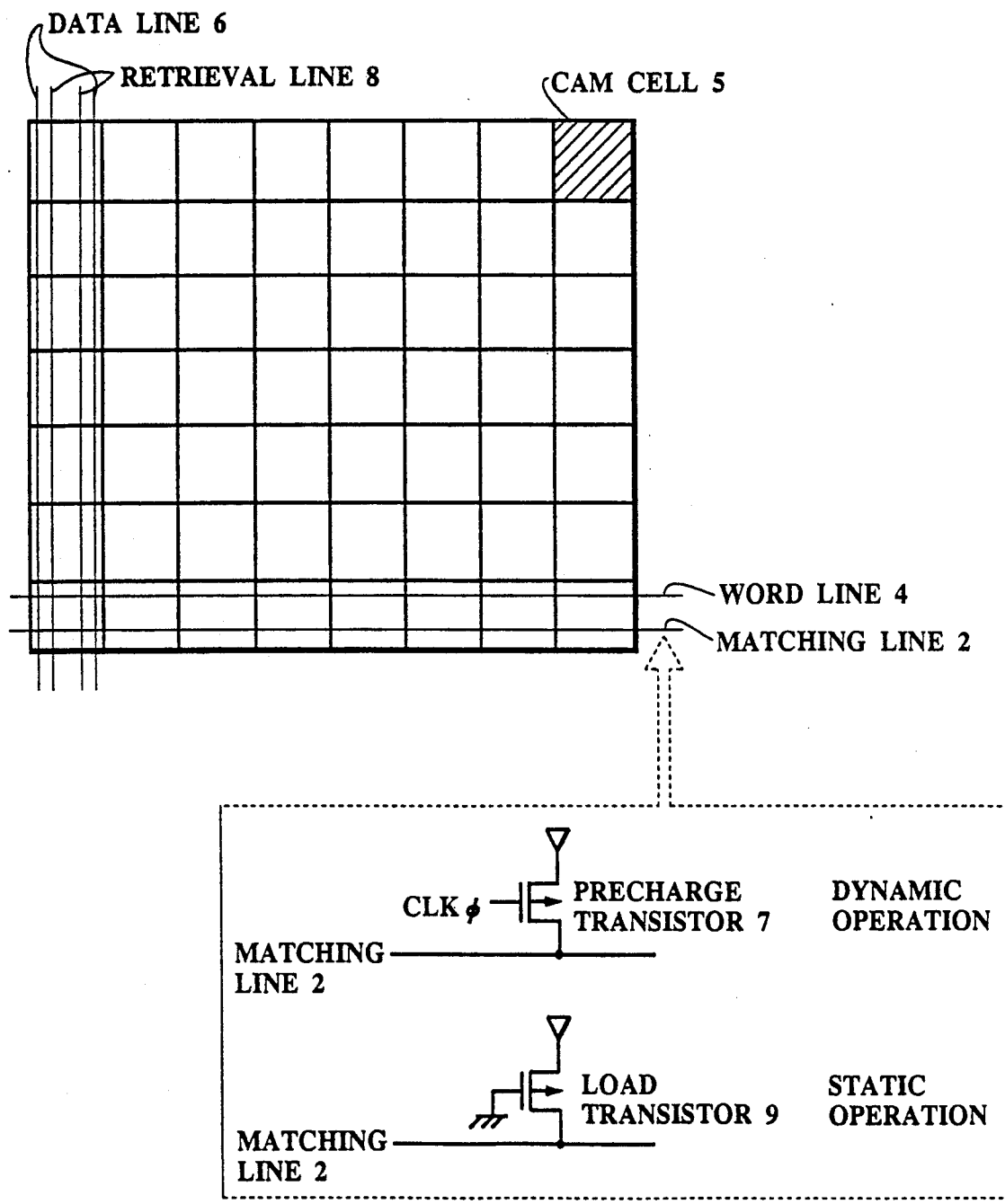
FIG. 3 is a entire diagram of the conventional CAM.

In the cell block, each of XOR portions in the six CAM cells (each of the cell blocks 13 comprises the six CAM cells per one row as shown in FIG. 4) is connected to each of the block matching line 21. Accordingly, a load capacity of the block matching line 23 is decreased to about ⅓ that of the matching line of the conventional CAM, in which all of the CAM cells connected to the word line 4 per one line are connected to the matching line 2 as shown in FIG. 3.

Next, as shown in FIG. 5, each of the block matching lines 21 is set in a precharge state by a precharge transistor 29 P-channel controlled in synchronism with a clock signal $\phi$.

When a retrieval operation fails on at least one of the CAM cells 11 connected to the block matching line 21, the block matching line 21 becomes L-level. On the other hand, the array matching line 25 is kept H-level by the precharge transistor 31 of N-channel controlled in synchronism with a inverse clock signal $\bar{\phi}$ to the clock signal $\phi$.

When at least one of the block matching lines 21 is in L-level and the transfer transistor 27 is H-level, the array matching line 25 become H-level and thereby a result as a failure of the retrieval operation is output on it.

On the other hand, when all of the block matching lines 21 are H-level and thereby all of the transfer transistor 27 are not in electrical continuity, the array matching line 25 is kept L-level and a result as a success of a retrieval operation is output on it.

Figure 6:
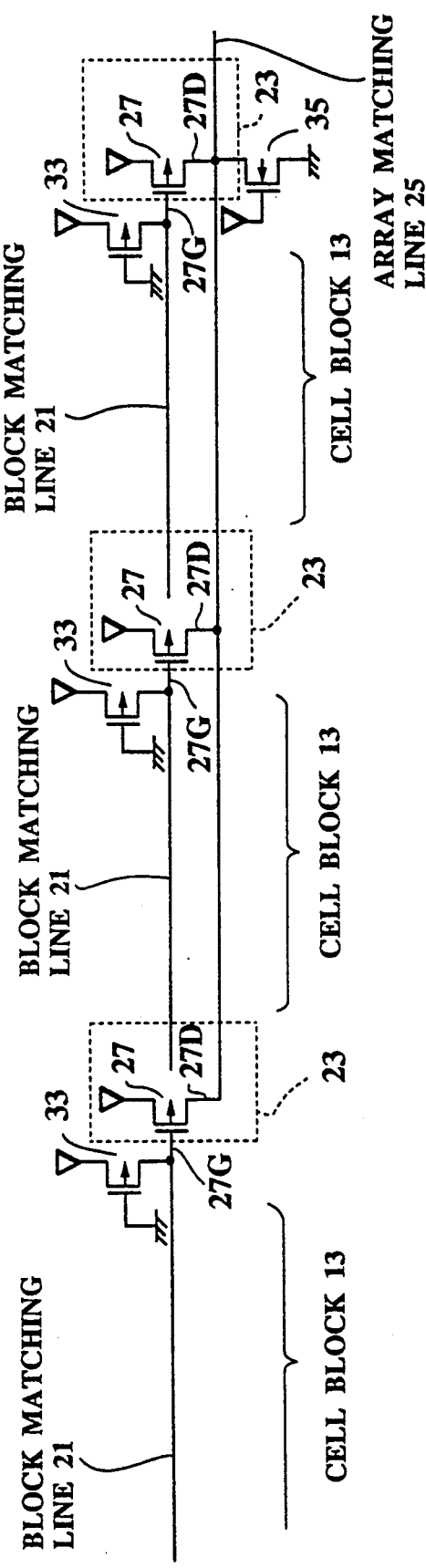

While, when the block matching lines 21 and array matching line 25 are performed statically, for example, a circuit of a composition as shown in FIG. 6 is used. The composition in the same diagram, by keeping always in electrical continuity to the precharge transistors 29 and 31 as shown in FIG. 5, the transistors 33 and 35 are behaved as a load transistor.

Figure 7:
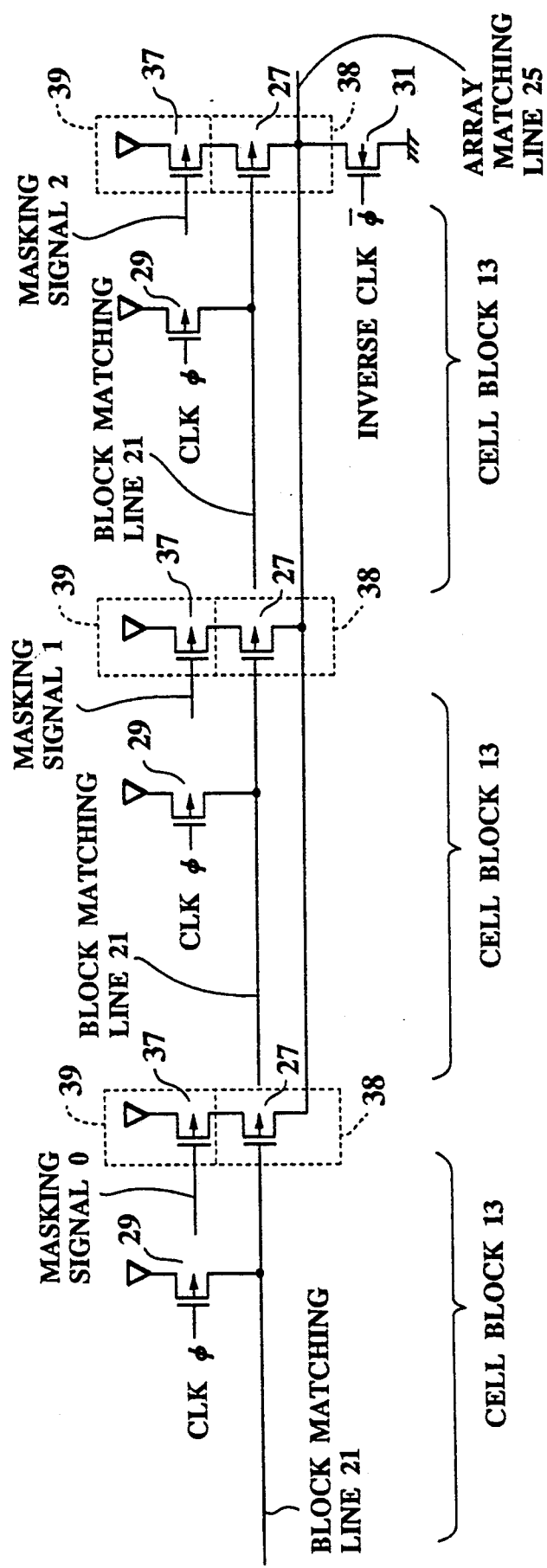
FIG. 7 is a compositional diagram added a masking function composed of a P-channel transistor to the partial composition of the CAM of the CAM shown in FIG. 5.

FIG. 7 is a compositional diagram added a masking function composed of a P-channel transistor to the CAM shown in FIG. 5. In the same diagram, by using the CAM having the masking function, for instance lower-bits of the retrieval data are masked so that upper-bits of it can be only retrieved with a high speed. A reference number 39 designates a masking transistor as a masking means.

Compared to the CAM cells as shown in FIG. 5, the CAM having the composition as shown in FIG. 7 includes transfer circuits 38 and the masking circuits 39. Each of the transfer circuits 38 and the masking circuits 39 contains a masking transistor 37 of P-channel controlled in electrical continuity by different masking signals 0, 1, and 2 inputted between the transfer transistors 27 and the power source (a symbol "∇" as shown in FIG. 7), respectively.

When the masking signal is H-level, the masking transistor 37 becomes in electrical continuity and thereby the transfer transistor 27 becomes in cut-off state. Accordingly the retrieval function at each of the cell blocks 13 as the object of the masking operation is masked.

By the way, a masking operation in the conventional CAM is performed by controlling retrieval lines (not shown). However, in the CAM having the above mentioned composition of this embodiment, the masking function is simply realized by connecting in serial the masking transistor 37 directly to the transfer transistor 27 as shown in FIG. 7. Namely, in the CAM of the embodiment having the composition in which each matching lines is divided into a plurality of block matching lines, the masking function is realized easily by adding a few components (i.e. adding the masking transistor 37).

It can be considered to have another composition of the CAM in which the transfer transistor 27 is arranged in the power source "∇" side and the masking transistor 37 is arranged in the array matching line 25 side. However, the CAM having the composition as shown in FIG. 7 can be operated more faster in terms of operational speed than the composition.

Operation of the CAM having the above mentioned composition of the embodiment as shown in FIG. 7 based on the CAM as shown in FIG. 4 will be described with referring to the FIGS. 8A to 8C. In the same diagrams, 38A, 38B, and 38C are transfer circuits of P-channel and 39A, 39B, and 39C are matching circuits of P-channel having masking function each.

Figure 8:
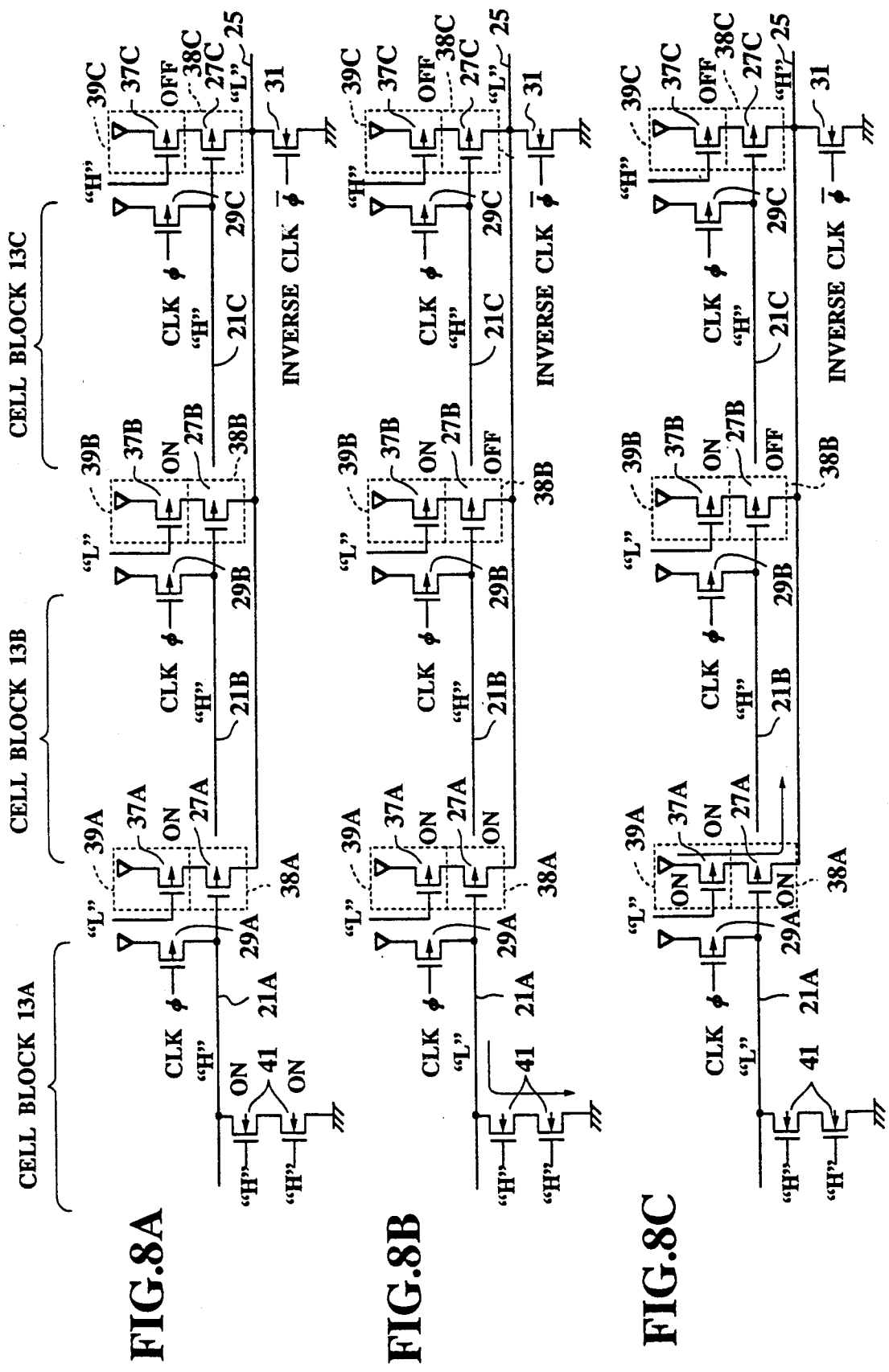
FIGS. 8A to 8C are operational diagrams for explaining the operation of the sectional composition of the CAM shown in FIG. 7.

In this embodiments, as shown in FIG. 8A, the masking transistor 37C in the masking circuit 39C is not in electrical continuity (OFF state) and thereby a retrieval operation of a cell block 13C is masked.

For example, in a state in which the cell block 13C is only masked and each of the block matching lines 21A, 21B, and 21C is H-level (precharge state) and the array matching line 25 is L-level, one of the cell blocks connected to the same word line, for example the cell block 13A, fails to a retrieval operation and the other cell blocks succeeds (see FIG. 8A). In this case, the block matching lines 21A becomes L-level by no more than one CAM cell (not shown) and the array matching line 25 becomes H-level by no more than one transfer transistors 27A. A driving speed of the block matching line 21A, 21B, and 21C and the array matching line 25 therefore become minimum. Namely, the driving efficiency of the cell blocks is minimized. In more detail, as shown in FIG. 8B, a transistor 41 of N-channel in the XOR portion of the CAM cell 11 in one of the CAM cells in the cell block 13A is in electrical continuity. Accordingly, the block matching line 21A becomes L-level by discharging a precharge capacity of the block matching line 21A through the transistor 41. At this time, the speed of transformation from the H-level to the L-level on the block matching line 21A becomes about three times as compared to that of the conventional CAM in which the eighteen CAM cells are connected to the same word line by the decreased of the load capacity of the above mentioned block matching lines 21A, 21B, and 21C.

When the block matching line 21A changes from H-level to L-level, as shown in FIG. 8C, the transfer transistor 27A of the cell block 13A is in electrical continuity and thereby the array matching line 25 changes from L-level to H-level. Consequently, the result as the information of the failure of the retrieval operation is output to the array matching line 25. At this time, a time required for the array matching line 25 to become from the H-level to L-level. However, a main load capacity of the array matching line 25 is only the capacity of the precharge transistor 31 of N-channel and the transfer transistor 27A, 27B, and 27C of each of the cell blocks 13A, 13B, and 13C. The delay time of the change from L-level to H-level on the array matching line 25 is not large as compared to that of the conventional CAM.

Namely, the high speed operation on the block matching lines 21A, 21B, and 21C is keeped. Therefore compared to the conventional CAM having the composition as shown in FIG. 3, such as the unique matching line per one line, the composition of the CAM of this embodiment can be output the retrieval results at a high speed.

Moreover, this invention is not limited to the above mentioned embodiments. In the embodiments, the CAM cells is divided into the three portions, the number of the divion is determined to optimise in consideration of the delay time of the transfer time from the block matching line to the array matching line and occupied areas the transfer transistors in a chip of LSI.

Figure 9:
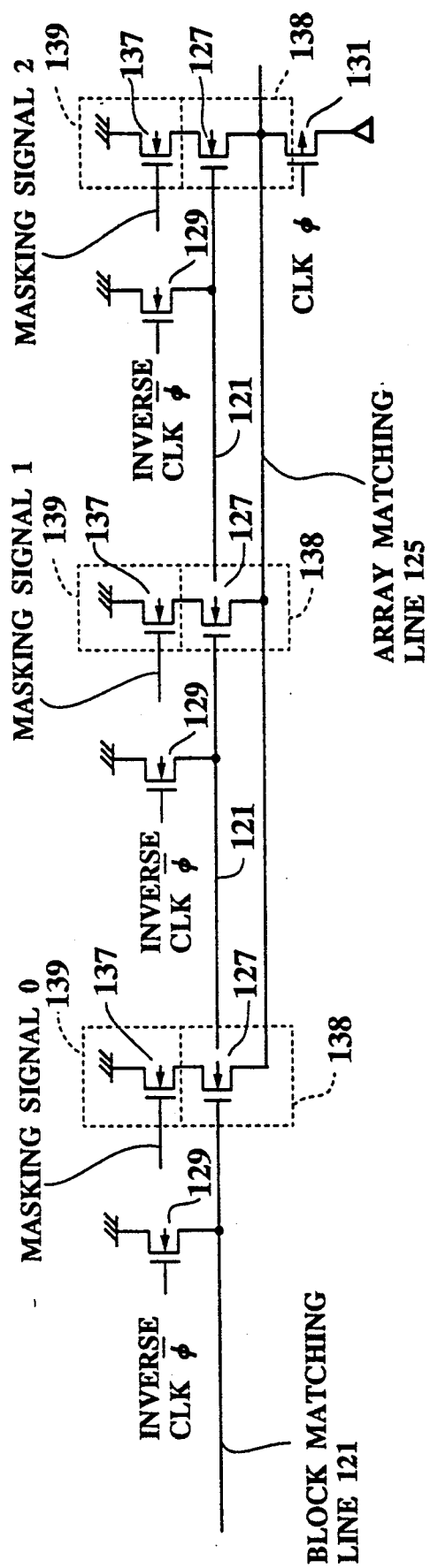
FIG. 9 is a compositional diagram added a masking function composed of a N-channel transistor to the CAM shown in FIG. 5.

Furthermore, in this invention, a porarity of the transistors constitute the CAM cell and others transistors such as the transfer transistor and the matching transistor may be set in reverse to the above mentioned embodiments. For example, the CAM cells (not shown) comprise P-channel transistors. Moreover, transfer transistors 127 as transfer circuits 138, matching transistors 137 as matching circuits 139, and precharge transistors 129 for the block matching lines compose N-channel transistors as shown in FIG. 9. In this case, a precharge transistor 131 for the array matching line comprises a P-channel transistor. An inverse clock signal $\phi$ is inputted to the gate terminal of each of the precharge transistors 129 and a clock signal $\phi$ is inputted to the gate terminal of the precharge transistor 131.

Moreover, the similar effect can be obtained by operating statically in electric state the block matching lines 21 and the array matching lines 25.

Various modification will become possible for those skilled in the art after receiving the teachings of the present disclosure without departing from the scope thereof.

What is claimed is:

1. A content addressable memory (CAM) comprising:
   a plurality of CAM cells;
   a CAM cell block comprising the CAM cells;
   a CAM array obtained by arranging in a plurality of the CAM cell blocks;
   a word line for connecting to the CAM cells arranged a predetermined direction in the CAM cell block;
   a block matching line for outputting a result of retrieval operation at each of the CAM cell connected to the same word line in the same CAM block and installed corresponding to the same word line;
   a array matching line for outputting the result of the retrieval operation at each of the block matching lines arranged the predetermined direction; and
   a transfer means for transferring the result of the retrieval operation on the block matching line to the array matching line.

2. A content addressable memory according to claim 1, wherein the predetermined direction is row direction.

3. A content addressable memory according to claim 1, wherein the predetermined direction is line direction.

4. A content addressable memory according to claim 1, wherein the CAM cells comprise N-channel transistors and the transfer means comprise P-channel transistors in which a gate terminal thereof is connected to the block matching line and a source terminal thereof is connected to a high-voltage power source for adding a voltage and a drain terminal thereof is connected to the array matching line.

5. A content addressable memory according to claim 1, wherein the CAM cells comprise P-channel transistors and the transfer means comprise N-channel transistors in which a gate terminal thereof is connected to the block matching line and a source terminal thereof is connected to a low-voltage power source and a drain terminal thereof is connected to the array matching line.

6. A content addressable memory according to claim 1, and further comprising a means for masking a retrieval data at each of the CAM cell blocks.

7. A content addressable memory according to claim 6, wherein the predetermined direction is row direction.

8. A content addressable memory according to claim 6, wherein the predetermined direction is line direction.

9. A content addressable memory according to claim 6, wherein the CAM cells comprise N-channel transistors and the transfer means and the masking means comprise P-channel transistors in which a gate terminal of the transfer means is connected to the block matching line and a drain terminal thereof is connected to the array matching line and a source terminal thereof is connected to a drain terminal of the masking means and a gate terminal of the masking means is connected to a masking control terminal and a source terminal of the masking means is connected to a high-voltage power source for adding a voltage.

10. A content addressable memory according to claim 6, wherein the CAM cells comprise P-channel transistors and the transfer means and the masking means comprise N-channel transistors in which a gate terminal of the transfer means is connected to the block matching line and a drain terminal thereof is connected to the array matching line and a source terminal thereof is connected to a drain terminal of the masking means and a gate terminal of the masking means is connected to a masking control terminal and a source terminal of the masking means is connected to a low-voltage power source.

* * * * *